United States Patent
Nakamura et al.

(10) Patent No.: US 6,297,544 B1
(45) Date of Patent: Oct. 2, 2001

(54) SEMICONDUCTOR DEVICE AND METHOD FOR MANUFACTURING THE SAME

(75) Inventors: Atsushi Nakamura, Fuchu; Mitsuaki Katagiri, Koganei; Kunihiro Tsubosaki, Hino; Asao Nishimura, Kokubunji; Masachika Masuda, Tokorozawa, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/462,840
(22) PCT Filed: Aug. 29, 1997
(86) PCT No.: PCT/JP97/03020
§ 371 Date: Jan. 14, 2000
§ 102(e) Date: Jan. 14, 2000
(87) PCT Pub. No.: WO99/12203
PCT Pub. Date: Mar. 11, 1999

(51) Int. Cl.$^7$ .................................................. H01L 23/495
(52) U.S. Cl. ......................... 257/666; 257/670; 257/676; 257/696; 257/700; 257/787; 438/106; 438/111; 438/112
(58) Field of Search .................................... 438/106, 111, 438/112; 257/666, 670, 676, 696, 700, 787

(56) References Cited

U.S. PATENT DOCUMENTS

| | | | |
|---|---|---|---|
| 5,394,008 | * 2/1995 | Ito et al. | 257/666 |
| 5,498,901 | * 3/1996 | Chillara | 257/666 |
| 5,821,605 | * 10/1998 | Hong et al. | 257/666 |
| 5,917,235 | * 6/1999 | Imura | 257/669 |
| 6,066,887 | * 5/2000 | Hong et al. | 257/668 |

FOREIGN PATENT DOCUMENTS

| | | |
|---|---|---|
| 2-246125 | 10/1990 | (JP) . |
| 6-97351 | 4/1994 | (JP) . |
| 7-335818 | 12/1995 | (JP) . |
| 8-274234 | 10/1996 | (JP) . |
| 8-316405 | 11/1996 | (JP) . |

* cited by examiner

Primary Examiner—Matthew Smith
Assistant Examiner—B. V. Keshavan
(74) Attorney, Agent, or Firm—Mattingly, Stanger & Malur, P.C.

(57) ABSTRACT

A semiconductor device having power supply leads and signal leads on the main surface of a semiconductor chip. Since floating capacitance applied to the power supply leads can be made large and floating capacitance applied to the signal leads can be made small by making the interval between the signal leads and the semiconductor chip larger than the interval between the power supply leads and the semiconductor chip, the prevention of fluctuations in power source potential and the acceleration of the signal propagation speed can be carried out at the same time. As a result, the electric characteristics of the semiconductor device can be improved.

19 Claims, 11 Drawing Sheets

SEMICONDUCTOR DEVICE AND METHOD FOR MANUFACTURING THE SAME

TECHNICAL FIELD

The present invention relates to a semiconductor device and, particularly, to an effective technology for application in a semiconductor device having signal leads and power supply leads on a semiconductor chip.

BACKGROUND ART

There is available a semiconductor device in which a semiconductor chip having a circuit system mounted thereon is sealed with a resin sealer. In this semiconductor device, the die pad (also called "tub") of a lead frame is omitted and an LOC (Lead On Chip) structure or a COL (Chip On Lead) structure which can be used for large-sized chips is employed. An LOC structure semiconductor device is disclosed by Japanese Patent Laid-open No. Hei 2-246125 (laid open on Oct. 1, 1990), for example. A COL structure semiconductor device is disclosed by Thesis No. ICD 89-103 of the technical research report of the Denshi Joho Tsushin Gakkai published in March, 1989.

The above LOC structure semiconductor device is constituted such that leads are fixed on the main surface (circuit formed surface) of a semiconductor chip through an insulating film. The insulating film has an adhesive layer formed of a polyimide-based resin on both sides (front and rear sides) of a resin substrate made from a polyimide-based resin. Since this insulating film easily absorbs water, water absorbed by the insulating film is vaporized and expanded with heat at the time of a temperature cycle test which is an environment test for a semiconductor device and heat when a semiconductor device is mounted, thereby causing the cracking of a resin sealer (package cracking).

An attempt is then made to arrange leads on the main surface of a semiconductor chip by eliminating the insulating film. This technology is disclosed by Japanese Patent Laid-open No. Hei 8-274234 (laid open on Oct. 18, 1996), for example.

A semiconductor chip having a circuit system mounted thereon has such a structure that a multi-layer wiring layer which consists of a plurality of wiring layers and a plurality of interlayer insulating layers is formed on a semiconductor substrate and a surface protective film (final protective film) is formed on the multi-layer wiring layer. Power source wires for supplying an operation potential (Vcc) and a reference potential (Vss) to transistor elements constituting the circuit system are formed in each wiring layer of the multi-layer wiring layer. Further, signal wires for connecting the transistor elements are formed in each wiring layer. The power source wires and the signal wires are electrically connected to respective external terminals for power source and respective external terminals for signals formed on the uppermost wiring layer of the multi-layer wiring layer.

Meanwhile, power supply leads electrically connected to the external terminals for power source by wires and signal leads electrically connected to the external terminals for signals by wires are formed on the main surface of the semiconductor chip. Floating capacitance (parasitic capacitance) is applied to the power supply leads and the signal leads because the power supply leads and the signal leads are formed on the power source wires formed in the multi-layer wiring layer of the semiconductor chip through the surface protective film and an insulator such as the insulating film. Floating capacitance applied to the power supply leads is preferably large in order to prevent fluctuations in power source potential caused by switching noise. Parasitic capacitance applied to the signal leads is preferably small in order to increase the signal propagation speed.

However, as the power supply leads and the signal leads are situated on the same plane on the main surface of the semiconductor chip, floating capacitance applied to the power supply leads and floating capacitance applied to the signal leads are the same, whereby the prevention of fluctuations in power source potential and the acceleration of the signal propagation speed cannot be carried out at the same time, thereby preventing improvement on the electric characteristics of the semiconductor device. Particularly when the insulating film is eliminated and leads are fixed on the main surface of the semiconductor chip through an adhesive material, floating capacitance applied to the power supply leads and the signal leads become large, which is preferred for the prevention of fluctuations in power source potential but not preferred for the acceleration of the signal propagation speed.

It is an object of the present invention to provide a technology which can improve the electric characteristics of a semiconductor device.

The above and other objects and new features of the present invention will become apparent from the following description when taken into conjunction with the accompanying drawings.

DISCLOSURE OF THE INVENTION

Overviews of representatives of the present invention disclosed in this specification are described briefly as follows.

(1) There is provided a semiconductor device having power supply leads and signal leads on the main surface of a semiconductor chip, wherein the interval between the signal leads and the semiconductor chip is made larger than the interval between the power supply leads and the semiconductor chip. The signal leads are separated from the semiconductor chip and the power supply leads are fixed to the main surface of the semiconductor chip. Further, the power supply leads are fixed to the main surface of the semiconductor chip directly or through an adhesive layer.

A surface protective film is formed on the main surface of the semiconductor chip and power source wires electrically connected to the power supply leads are formed under the surface protective layer.

The power supply leads and the signal leads are electrically connected to respective external terminals arranged on the main surface of the semiconductor chip, the semiconductor chip, the inner portions (inner leads) of the power supply leads, the inner portions of the signal leads and the wires are sealed by a resin sealer, and the outer portions (outer leads) of the power supply leads and the signal leads are drawn outside the resin sealer.

(2) There is provided a semiconductor device comprising:
a rectangular semiconductor chip having a plurality of semiconductor elements and a plurality of external terminals on the main surface, the plurality of external terminals being arranged in a longitudinal direction;
first leads and second leads, each having inner portions and outer portions, parts of the inner portions being arranged on the main surface of the semiconductor chip, and the end portions of the inner portions being arranged near the plurality of external terminals and electrically connected to the plurality of external terminals; and a rectangular resin sealer for sealing the semiconductor chip and the inner portions of the first leads and the second leads, whose long sides extend along the long sides of the semiconductor chip and whose short sides extend along the short sides of the semiconductor chip, wherein the outer portions of the first leads and the second leads project from the long sides of the resin sealer;

the inner portions of the first leads and the second leads extend over the short sides of the semiconductor chip and lie on the main surface of the semiconductor chip;

the distance between parts of the inner portions of the second leads lying on the main surface of the semiconductor chip and the main surface of the semiconductor chip is larger than the distance between parts of the inner portions of the first leads lying on the main surface of the semiconductor chip and the main surface of the semiconductor chip; and the first leads are connected to fixed potential terminals out of the plurality of external terminals and the second leads are connected to signal terminals out of the plurality of external terminals.

Since floating capacitance applied to the power supply leads can be made large and floating capacitance applied to the signal leads can be made small by the above means, the prevention of fluctuations in power source potential and the acceleration of the signal propagation speed can be carried out at the same time. As a result, the electric characteristics of a semiconductor device can be improved.

BEST MODE FOR CARRYING OUT THE INVENTION

The constitution of the present invention will be described hereinunder with reference to an embodiment.

Elements having the same functions are given the same reference symbols in all the figures for explaining the embodiment and their descriptions are not repeated.

Figure 1:
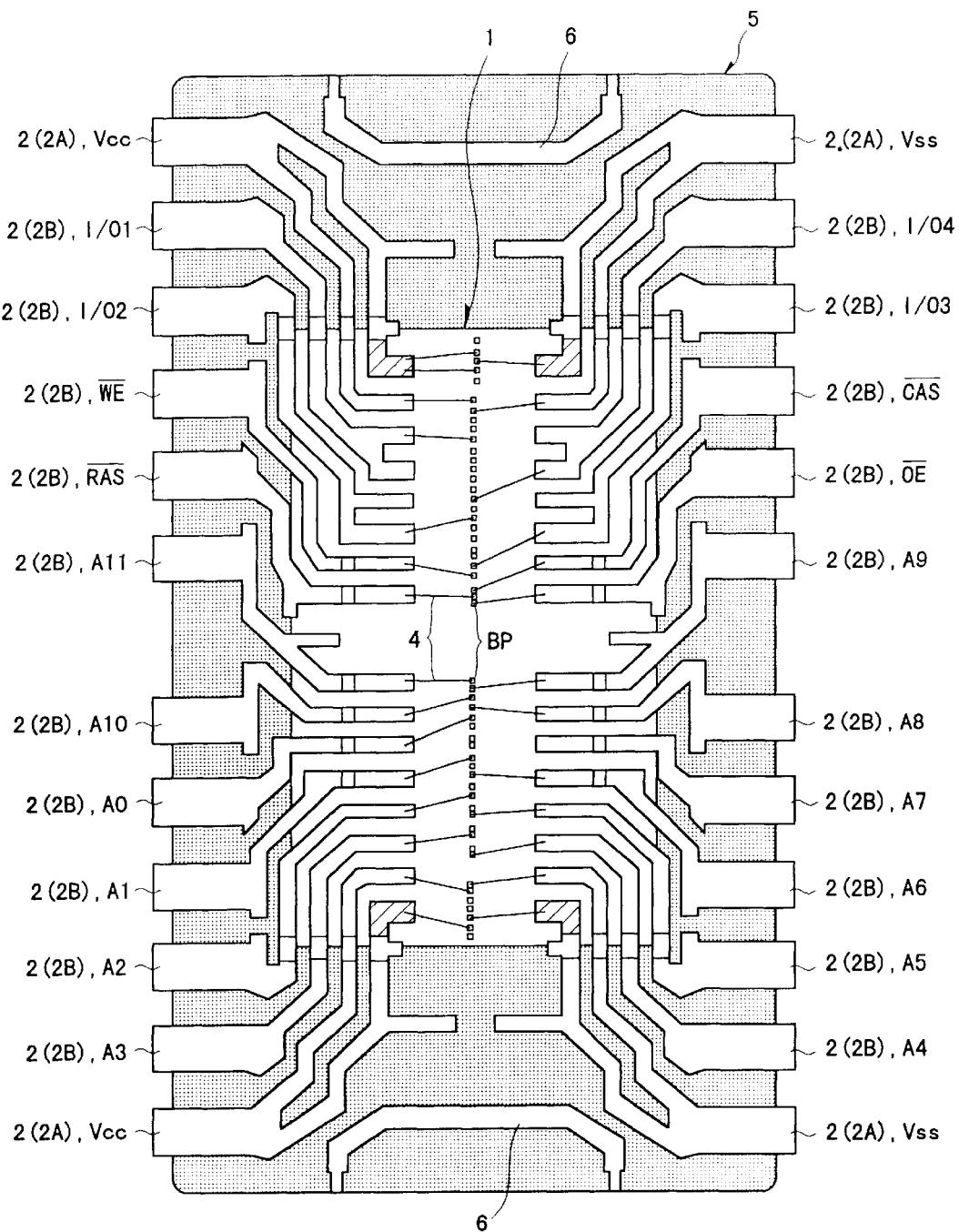
FIG. 1 is a plan view of a semiconductor device according to an embodiment of the present invention from which a top portion of a resin sealer is removed.
Figure 2:
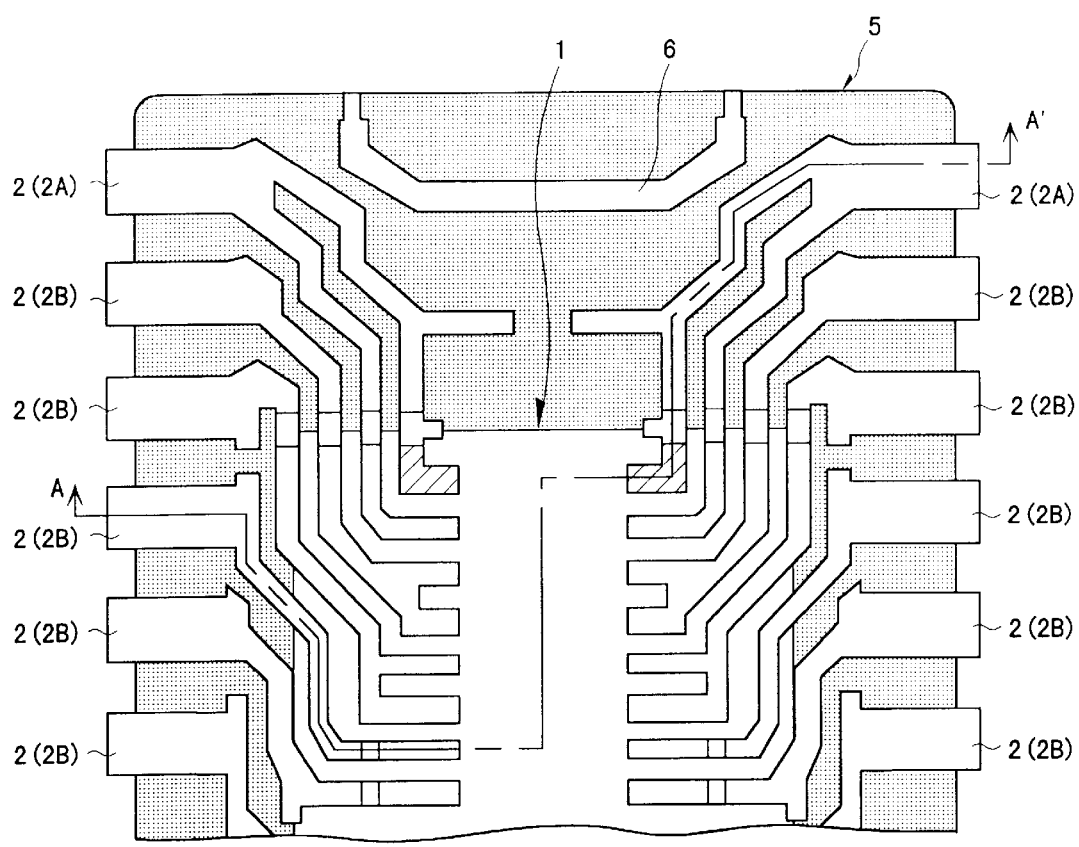
FIG. 2 is an enlarged plan view of key parts of FIG. 1.
Figure 3:
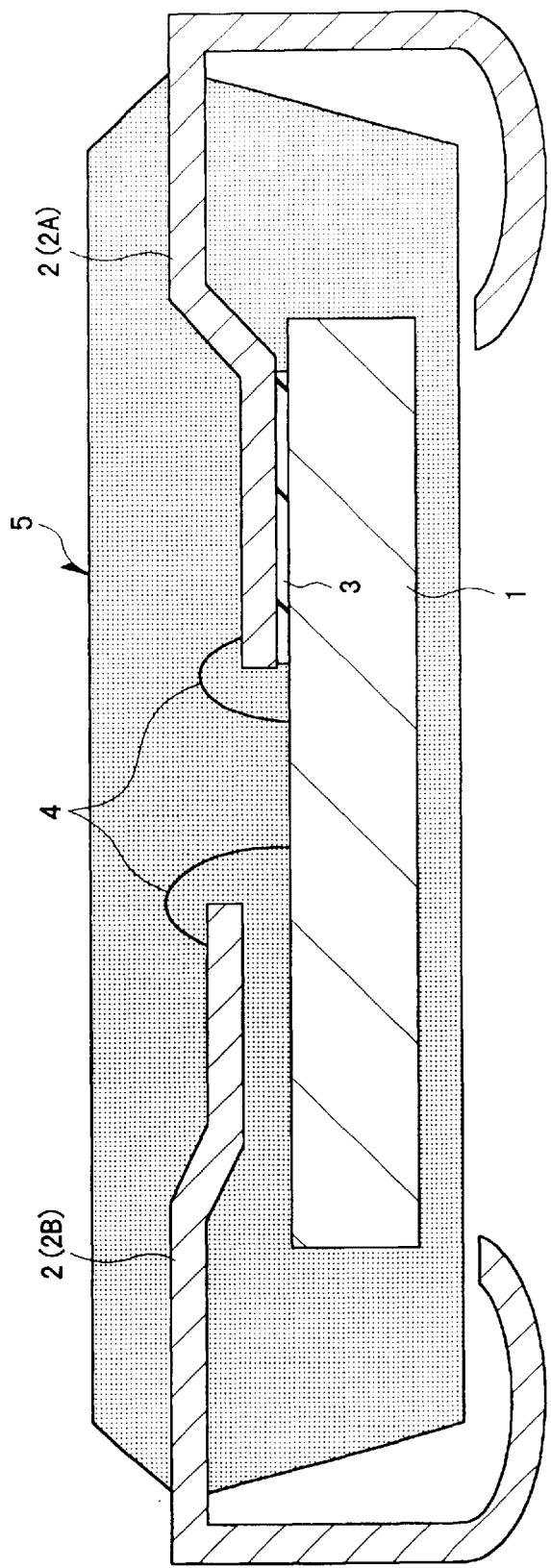
FIG. 3 is a sectional view of the above semiconductor device cut on line A—A' of FIG. 2.

A semiconductor device according to an embodiment of the present invention has an LOC structure that a plurality of leads 2 are formed on the main surface (circuit formed surface) of a semiconductor chip 1 as shown in FIGS. 1, 2 and 3.

The plane shape of the semiconductor chip 1 is not limited to this but is formed rectangular, for example. This semiconductor chip 1 has, for example, a DRAM (Dynamic Random Access Memory) mounted thereon as a circuit system. In the center area of the main surface of the semiconductor chip 1, a plurality of external terminals (bonding pads) BP are arranged in the longitudinal direction of the center region.

The plurality of leads 2 are electrically connected to the plurality of external terminals (bonding pads) BP arranged on the main surface of the semiconductor chip 1 by wires 4, respectively. The wires 4 are, for example, gold (Au) wires. The wires 4 may be, for example, aluminum (Al) wires, copper (Cu) wires, metal wires coated with an insulating resin on the surface, or the like. The wires 4 are connected by a bonding method making use of thermal press bonding and ultrasonic vibration.

The semiconductor chip 1, the inner portions (inner leads) of the plurality of leads 2, the wires 4 and the like are sealed by a resin sealer 5. The resin sealer 5 is made from, for example, a biphenyl-based resin containing a phenol-based curing agent, silicone rubber, filler and the like in order to reduce stress. The resin sealer 5 is formed by, for example, a transfer molding method which is suitable for mass-production. The transfer molding method uses a metal mold having a pot, runner, inflow gate, cavity and the like to form a resin sealer by injecting a resin into the cavity from the pot through the runner and the inflow gate by pressure. The plane shape of the resin sealer 5 is not limited to this but is rectangular, for example.

The outer portions (outer leads) of the plurality of leads 2 are laid from the resin sealer 5 to the outside of the resin sealer 5 and bent like letter J. The outer portions of the plurality of leads 2 are formed by disconnecting them from the frame body of a lead frame after the resin sealer 5 is formed and molding them into a predetermined shape in the production process of a semiconductor device.

Support leads 6 are arranged outside the two opposed short sides of the semiconductor chip 1. The support leads 6 are sealed by the resin sealer 5 together with the semiconductor chip 1, the inner portions of the plurality of leads 2 and the wires 4. The support leads 6 are used to support the resin sealer 5 in the frame body of the lead frame in the production process of a semiconductor device.

The plurality of leads 2 are divided into two groups. The leads 2 of one group are mainly arranged on the side of one of the two opposed long sides of the semiconductor chip 1. The leads 2 of the other group are mainly arranged on the side of the other long side of the semiconductor chip 1. One ends of the leads 2 of one group are disposed in the arrangement direction of the external terminals BP of the semiconductor chip 1 and the other ends are disposed along one of the long sides of the resin sealer 5 which faces one of the long sides of the semiconductor chip 1. One ends of the leads 2 of the other group are disposed in the arrangement direction of the external terminals BP of the semiconductor chip 1 and the other ends are disposed along the other long side of the resin sealer 5 which faces the other long side of the semiconductor chip 1. That is, the semiconductor device of this embodiment is not limited to this but has a two-direction lead layout structure.

Four out of the plurality of leads 2 are used as power supply leads 2A and the other leads are used as signal leads 2B. That is, the power supply leads 2A and the signal leads 2B are arranged on the main surface of the semiconductor chip 1. In FIG. 1, the power supply leads 2A and the signal leads 2B are each given terminal names. Vcc terminals are operational potential terminals whose power source potential is fixed to an operational potential (for example, 5 V). Vss terminals are reference voltage potential terminals whose power source potential is fixed to a reference potential (for example 0 V) I/01 to I/04 are data input/output terminals. A1 to A11 terminals are address input terminals. A RAS bar terminal is a low address strobe terminal. A CAS bar terminal is a column address strobe terminal. A WE bar terminal is a read/write enable terminal. An OE bar terminal is an output enable terminal.

Figure 5:
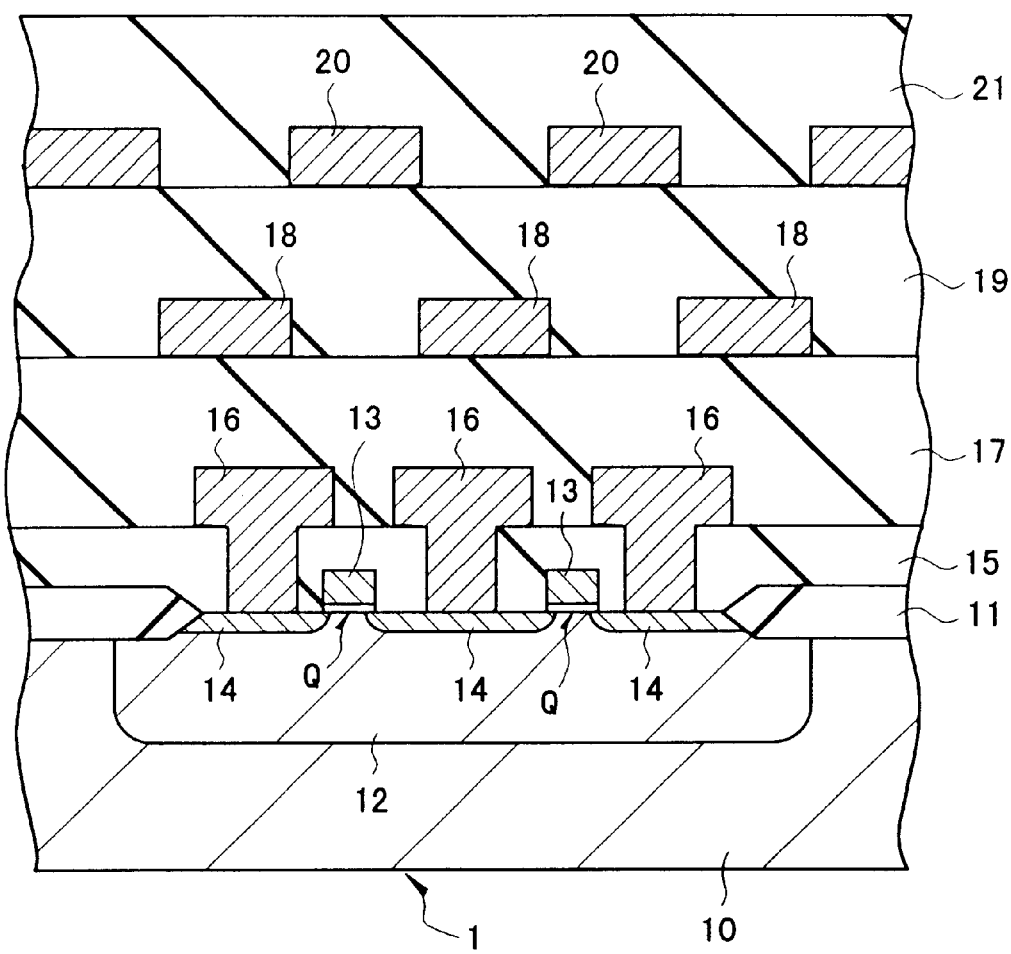
FIG. 5 is a sectional view of key parts showing the schematic constitution of a semiconductor chip mounted on the above semiconductor device.

The above semiconductor chip 1 is mainly composed of a p type semiconductor substrate 10 made from monocrystal silicon, for example, as shown in FIG. 5. A p type well region 12 is formed in the element forming region of the p type semiconductor substrate 10, and a MISFET (Metal Insulator Semiconductor Field Effect Transistor) Q constituting the peripheral circuit of a DRAM is formed in this p type well region 12. A field insulating film 11 is formed in the element separating region of the p type semiconductor substrate 10.

The above MISFET Q is mainly composed of the p type well region 12 which is a channel forming region, a gate insulating film, gate electrodes 13 and a pair of n type semiconductor regions 14 which are a source region and a drain region. The pair of n type semiconductor regions 14 are electrically connected to wires 16 formed of a first wiring layer through connection holes formed in the interlayer insulating film 15. The wires 16 are electrically connected to wires 18 formed of a second wiring layer through connection holes formed in the interlayer insulating film 17. The wires 18 are electrically connected to wires 20 formed of a third wiring layer through connection holes formed in the interlayer insulating film 17. The wires 20 are covered with a surface protective film (final protective film) 21. That is, the semiconductor chip 1 has a multi-layer wiring layer consisting of a plurality of wiring layers and a plurality of interlayer insulating layers formed on the semiconductor substrate 10 and the surface protective film 21 formed on the multi-layer wiring layer. The main surface of the semiconductor chip 1 is formed of the surface protective film 21. The surface protective film 21 is a laminate film comprising a silicon nitride film and a polyimide-based resin film (specifically, a polyimide isoindole quinazoline dione resin film) in order to improve the moisture resistance and α-ray resisting strength of a DRAM. The silicon nitride film is formed by plasma CVD (Chemical Vapor Deposition), for example, and the polyimide-based resin film is formed by rotation coating, for example. The above external terminals BP are formed on the uppermost wiring layer of the multi-layer wiring layer.

Power source wires (20, 18, 16) for supplying an operational potential (Vcc) and a reference potential (Vss) to the MISFET's Q included in the peripheral circuit of the DRAM are formed in the respective wiring layers of the multi-layer wiring layer of the semiconductor chip 1. Signal wires (20, 18, 16) for connecting the MISFET's Q are formed in the respective wiring layers of the multi-layer wiring layer. The power source wires are electrically connected to the external terminals for power source out of the external terminals BP arranged on the main surface of the semiconductor chip 1, and the external terminals for power source are electrically connected to the power supply leads 2A by the wires 4. The signal wires are electrically connected to the external terminals for signals out of the external terminals BP arranged on the main surface of the semiconductor chip 1, and the external terminals for signals are electrically connected to the signal leads 2B by the wires 4.

As shown in FIG. 3, each of the power supply leads 2A is formed such that the end portion of the inner portion are located on the semiconductor chip 1 side unlike the other portions. Similarly, each of the signal leads 2B is formed such that the end of the inner portion is located on the semiconductor chip 1 side unlike the other portions.

The end portion of the inner portion of the power supply lead 2A is bonded and fixed to the main surface of the semiconductor chip 1 through an adhesive layer 3, and the other portion of the inner portion is separated from the main surface of the semiconductor chip 1. The adhesive layer 3 and the resin of the resin sealer 5 are interposed between the inner portion of the power supply lead 2A and the semiconductor chip 1. The adhesive layer 3 is formed of a polyimide-based thermosetting resin, for example. In FIG. 1 and FIG. 2, the fixed area of the power supply lead 2A is shown by slant lines to make these figures more understandable.

The end portion and other portion of the inner portion of the signal lead 2B are separated from the main surface of the semiconductor chip 1 in the region of the semiconductor chip 1. The resin of the resin sealer 5 is interposed between the inner portion of the signal lead 2A and the main surface of the semiconductor chip 1.

Figure 4:
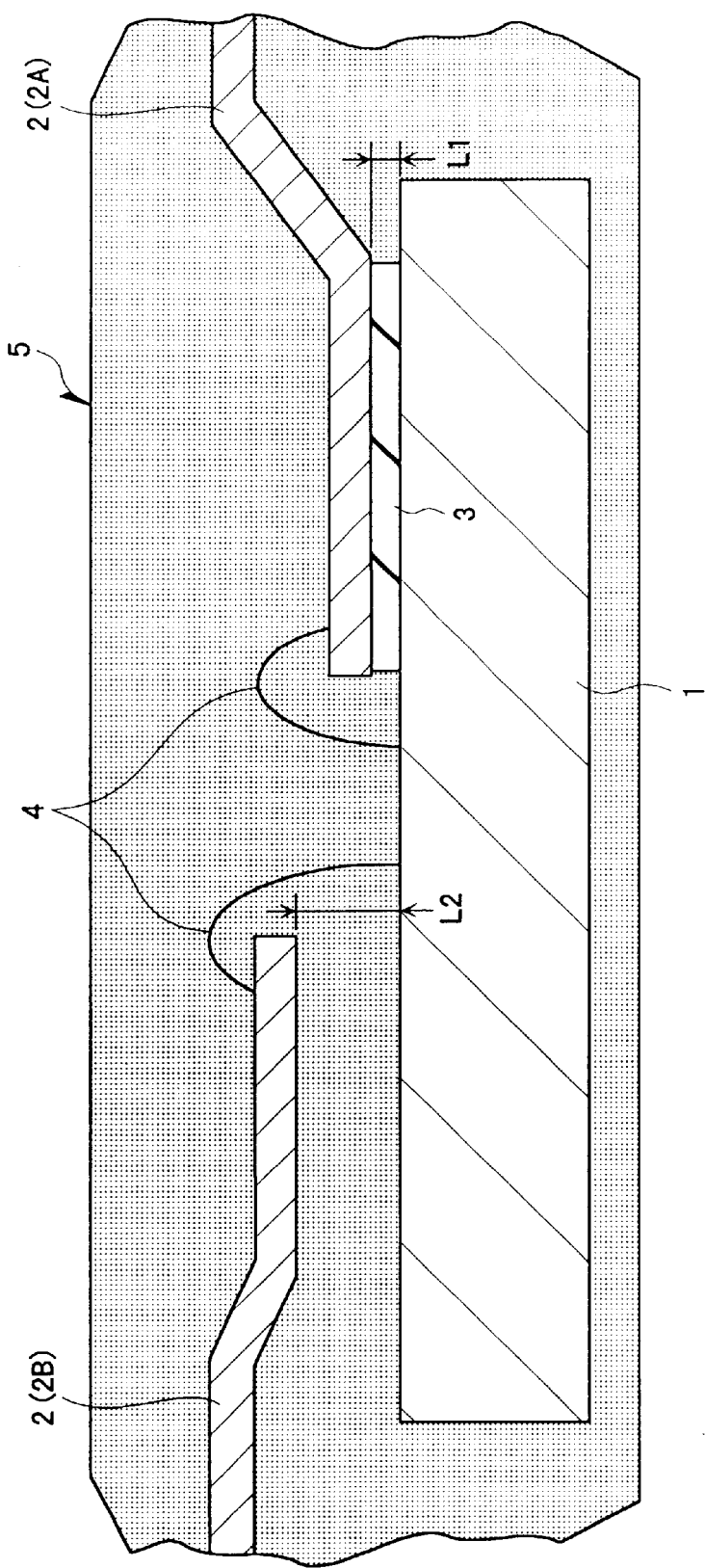
FIG. 4 is a enlarged sectional view of key parts of FIG. 3.

As shown in FIG. 4, the interval L2 between the end portion of the inner portion of the signal lead 2B and the semiconductor chip 1 is larger than the interval L1 between the end portion of the inner portion of the power supply lead 2A and the semiconductor chip 1. That is, the end portion of the signal lead 2B is located farther from the main surface of the semiconductor chip 1 than the end portion of the power supply lead 2B. The interval L2 is set to about 50 to 60 $\mu$m and the interval L1 is set to about 5 to 10 $\mu$m.

The inner portions of the power supply leads 2A and the signal leads 2B are arranged on the main surface of the semiconductor chip 1. The semiconductor chip 1 has a multi-layer wiring layer consisting of a plurality of wiring layers and a plurality of interlayer insulating layers formed on the semiconductor substrate 1 and the surface protective film 21 formed on the multi-layer wiring layer as described above. That is, the inner portions of the power supply leads 2A are formed on the power source wires formed in the multi-layer wiring layer of the semiconductor chip 1 through the surface protective layer 21, the adhesive layer 3 and an insulator such as the resin of the resin sealer 5, and the inner portions of the signal leads 2B are formed on the power source wires formed in the multi-layer wiring layer of the semiconductor chip 1 through the surface protective film 21 and an insulator such as the resin of the resin sealer 5. Therefore, floating capacitance (parasitic capacitance) is applied to the power supply leads 2A and the signal leads 2B. Floating capacitance applied to the power supply leads 2A is preferably large in order to prevent fluctuations in power source potential caused by switching noise. Floating capacitance applied to the signal leads 2B is preferably small in order to increase the signal propagation speed.

Floating capacitance applied to the signal leads 2B is smaller than floating capacitance applied to the power supply leads 2A because the interval L2 between the end portions of the inner portions of the signal leads 2B and the semiconductor chip 1 is made larger than the interval L1 between the end portions of the inner portions of the power supply leads 2A and the semiconductor chip 1. That is, floating capacitance applied to the power supply leads 2A can be made large and floating capacitance applied to the signal leads 2B can be made small by making the interval L2 between the end portions of the inner portions of the signal leads 2B and the semiconductor chip 1 larger than the interval L1 between the end portions of the inner portions of the power supply leads 2A and the semiconductor chip 1.

As shown in FIG. 1, the end portions of the four power supply leads 2A are disposed near the respective corner portions of the semiconductor chip 1 and bonded and fixed to the main surface of the semiconductor chip 1 through the adhesive layer 3. That is, the semiconductor chip 1 is supported by the four power supply leads 2A in the production process of the semiconductor device.

Each of the inner portions of the power supply leads 2A extends over the short side of the semiconductor chip 1, a part thereof lies on the main surface of the semiconductor chip 1 and the other part thereof lies outside the periphery of the semiconductor chip 1.

Out of the plurality of signal leads 2B, the inner portions of signal leads 2B used as I/O1 to I/O4 terminals and signal leads 2B used as A2 to A4 terminals extend over the short sides of the semiconductor chip 1 and parts thereof lie on the main surface of the semiconductor chip 1 and the other parts lie outside the periphery of the semiconductor chip 1. Out of the plurality of signal leads 2B, the inner portions of signal leads 2B used as A0 and A1 terminals and A5 to A11 terminals, a signal lead 2B used as a RAS bar terminal, a signal lead 2B used as a CAS bar terminal, a signal lead 2B used as a WE bar terminal and a signal lead 2B used as an OE bar terminal extend over the short sides of the semiconductor chip 1, parts thereof lie on the main surface of the semiconductor chip 1 and the other parts thereof lie outside the periphery of the semiconductor chip 1.

Since the external terminals BP arranged in the center region of the main surface of the semiconductor chip 1 are arranged along the long sides of the semiconductor chip 1, the leading portions lying on the main surface of the semiconductor chip 1 of the signal leads 2B extending over the short sides of the semiconductor chip 1 must be drawn around on the main surface to the semiconductor chip 1 compared with the signal leads 2B extending over the long sides of the semiconductor chip 1, thereby increasing their areas opposite to the main surface of the semiconductor chip 1. Therefore, as floating capacitance between the chip and the leads applied to the signal leads 2B becomes large, at least the distance between the signal leads 2B extending over the short sides of the semiconductor chip 1 and the main surface of the semiconductor chip 1 (distance between the chip and the leads) must be made large.

The bending (offsetting) of the signal leads 2B and the power supply leads 2A extending over the short sides of the semiconductor chip 1 is carried out on the leading portions extending linearly. The bending of the signal leads 2B extending over the long sides of the semiconductor chip 1 is also carried out on the leading portions extending linearly. The reason for this is that it is difficult to bend (offset) close leads which do not extend linearly. Therefore, as shown in FIG. 1, FIG. 2 and FIG. 3, the bent portions of the power supply leads 2A extending over the short sides of the semiconductor chip 1 and the bent portions of the signal leads 2B extending over the long sides of the semiconductor chip 1 differ from one another in location.

Figure 6:
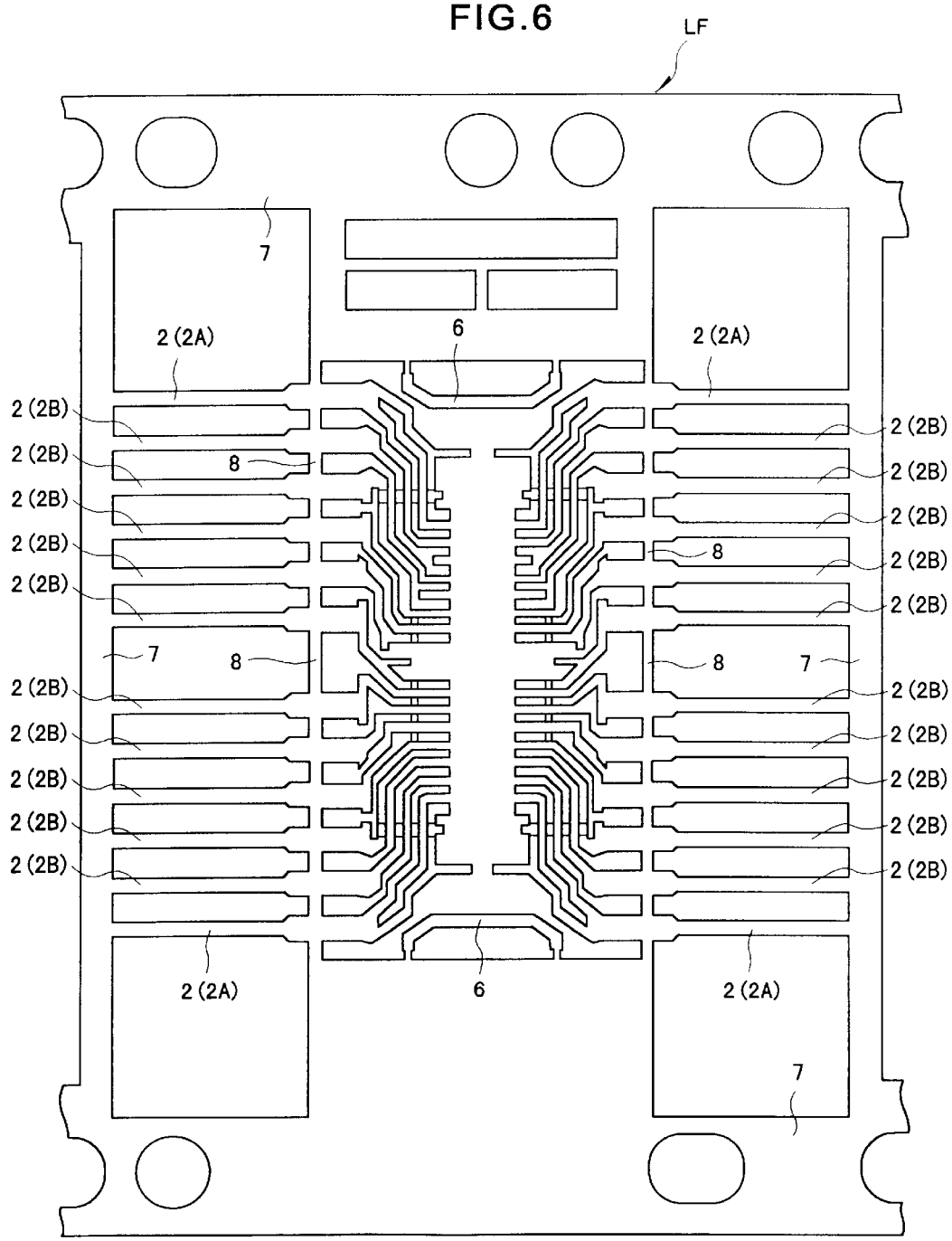
FIG. 6 is a plan view of a lead frame used in the production of the above semiconductor device.

The semiconductor device constituted as described above is formed by a production process using a lead frame LF shown in FIG. 6.

The lead frame LF has a plurality of leads 2 and two support leads 6 in a region specified by a frame body 7. The plurality of leads 2 are supported by the frame body 7 and connected to one another by tie bars (dam bars) 8. The two support leads 6 are supported by the frame body 7. The leads 2 and the support leads 6 are integrated with the frame body 7.

Each of the plurality of leads 2 consists of an inner portion sealed by the resin sealer 5 and an outer portion drawn to the outside of the resin sealer 5. The end portion of the inner portion is bent such that it is located lower than the other portion in a thickness direction of the device.

The lead frame LF is made from an iron (Fe)-nickel (Ni) based alloy, copper or copper alloy. This lead frame is formed by etching or pressing a plate material to form a predetermined lead pattern and pressing the end portions of the leads 2.

Out of the plurality of leads 2, the end portions of the inner portions of the power supply leads 2A are located lower than the end portions of the inner portions of the signal leads 2B in the thickness direction of the frame. That is, the end portions of the inner portions of the power supply leads 2A are greatly offset so that they become closer to the main surface of the semiconductor chip 1 than the end portions of the inner portions of the signal leads 2B.

Figure 7:
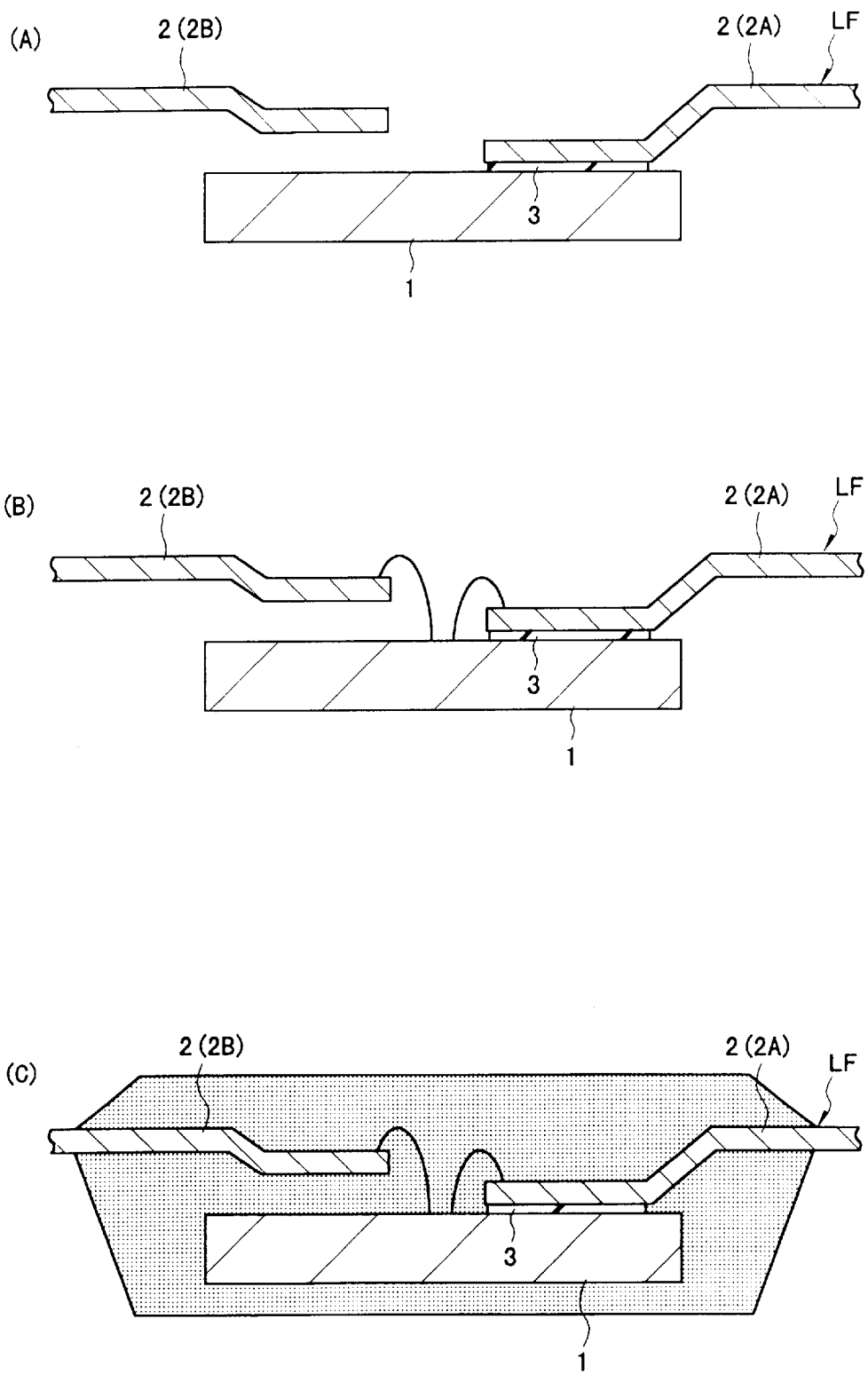
FIG. 7 is a sectional view of key parts for explaining the method of manufacturing the above semiconductor device.

A description is subsequently given of the method of producing the above semiconductor device with reference to FIG. 7.

The lead frame LF shown in FIG. 6 is first prepared.

Then, out of the plurality of leads 2 supported by the frame body 7 of the lead frame LF, the adhesive layer 3 is formed on the end portions of the inner portions of the four power supply leads 2A. The adhesive layer 3 is formed by coating, for example, a polyimide-based thermosetting resin on the chip fixing surface side of the end portions of the power supply leads 2A with a dispenser.

Thereafter, the power supply leads 2A of the lead frame LF are bonded and fixed to the main surface of the semiconductor chip 1 through the adhesive layer 3 to fix the lead frame LF to the semiconductor chip 1. The power supply leads 2A are fixed by press bonding under heating. In this step, the signal leads 2B of the lead frame LF are arranged away from the main surface of the semiconductor chip 1. The above steps are shown in FIG. 7(A).

The external terminals (BP) arranged on the main surface of the semiconductor chip 1 are electrically connected to the leads 2 of the lead frame LF by the wires 4. Out of the leads 2, the power supply leads 2A are electrically connected to the external terminals for power source and the signal leads 2B are electrically connected to the external terminals for signals. The wires 4 are connected by a bonding method making use of thermal press bonding and ultrasonic vibration. In this step, the connection of the signal leads 2B and the wires 4 is carried out while the end portions of the signal leads 2B are fixed to the main surface of the semiconductor chip 1 with a lead holding jig. The above steps are shown in FIG. 7(B).

Thereafter, the lead frame LF is placed between the upper mold and lower mold of a metal mold, and the semiconductor chip 1, the inner portions of the leads 2 and the support leads 6 are arranged in the cavity of the metal mold. The metal mold has a pot, runner, inflow gate and the like besides the cavity. In this step, the interval (L2) between the signal leads 2B and the semiconductor chip 1 is made larger than the interval (L1) between the power supply leads 2A and the semiconductor chip 1, the signal leads 2B are separated from the semiconductor chip 1, and the power supply leads 2A are fixed to the semiconductor chip 1.

A resin is injected into the cavity from the pot of the metal mold through the runner and the inflow gate by pressure, and while the interval (L2) between the signal leads 2B and the semiconductor chip 1 is larger than the interval (L1) between the power supply leads 2A and the semiconductor chip 1, the signal leads 2B are apart from the semiconductor chip 1, and the power supply leads 2A are fixed to the semiconductor chip 1, the semiconductor chip 1, the inner portions of the power supply leads 2A, the inner portions of the signal leads 2B, the wires 4, the support leads 6 and the like are sealed by a resin to form the resin sealer 5. The above steps are shown in FIG. 7(C).

The outer portions of the leads 2 are cut away from the lead body 7 of the lead frame LF, the tie bars 8 are cut away from the leads 2, the outer portions of the leads 2 are bent like letter J, and the support leads 6 are cut away from the lead body 7 of the lead frame LF to almost complete the semiconductor device shown in FIG. 1, FIG. 2 and FIG. 3. Thereafter, a temperature cycle test which is an environment test is made on the semiconductor device and the semiconductor device is shipped as a commercial product. The semiconductor device shipped as a commercial product is mounted on the mounting surface of a package substrate.

As described above, the following effects are obtained according to this embodiment.

(1) Floating capacitance (parasitic capacitance) applied to the power supply leads 2A can be made large and floating capacitance applied to the signal leads 2B can be made small by making the interval L2 between the end portions of the inner portions of the signal leads 2B and the semiconductor chip 1 larger than the interval L1 between the end portions of the inner portions of the power supply leads 2A and the semiconductor chip 1, separating the inner portions of the signal leads 2B from the main surface of the semiconductor chip 1, and fixing the end portions of the inner portions of the power supply leads 2A to the main surface of the semiconductor chip 1. Therefore, the prevention of fluctuations in power source potential and the acceleration of the signal propagation speed can be carried out at the same time. As a result, the electric characteristics of the semiconductor device can be improved.

(2) The interval between the end portions of the inner portions of the power supply leads 2A and the semiconductor chip 1 can be made smaller when the end portions of the inner portions of the power supply leads 2A are fixed to the main surface of the semiconductor chip 1 through the adhesive layer 3 than when the end portions of the inner portions of the power supply leads 2A are fixed to the main surface of the semiconductor chip 1 through an insulating film. Therefore, floating capacitance applied to the power supply leads 2A can be made large.

(3) The cracking of the resin sealer 5 (package cracking) caused by the vaporization and expansion of water absorbed by an insulating film can be prevented by eliminating the insulating film which easily absorbs water and fixing the end portions of the inner portions of the power supply leads 2A to the main surface of the semiconductor chip 1. Therefore, the reliability of the semiconductor device can be improved.

In this embodiment, the power supply leads 2A and the signal leads 2B are formed by bending the end portions of the inner portions. The signal leads 2B may be formed linear without bending. In this case, the interval L2 between the end portions of the signal leads 2B and the semiconductor chip 1 can be made much larger than the interval L1 between the power supply leads 2A and the semiconductor chip 1, thereby making it possible to further reduce floating capacitance to be applied to the signal leads 2B.

In this embodiment, the end portions of the power supply leads 2A are fixed to the main surface of the semiconductor chip 1 through the adhesive layer 3. The end portions of the power supply leads 2A may not be fixed to the main surface of the semiconductor chip 1. In this case, the support leads 6 are fixed to the main surface or the side surface of the semiconductor chip 1.

In this embodiment, the adhesive layer 3 is formed on the chip fixing surface side of the end portions of the power supply leads 2A in the production process of the semiconductor device. The adhesive layer 3 may be formed in the lead fixing region of the main surface of the semiconductor chip 1 in the production process of the semiconductor device.

In this embodiment, the end portions of the power supply leads 2A are fixed to the main surface of the semiconductor chip 1 through the adhesive layer 3. The surface protective film of the semiconductor chip 1 may be formed of a multi-layer film including the adhesive layer and the end portions of the power supply leads 2A may be directly fixed to the main surface of the semiconductor chip 1.

Figure 8:
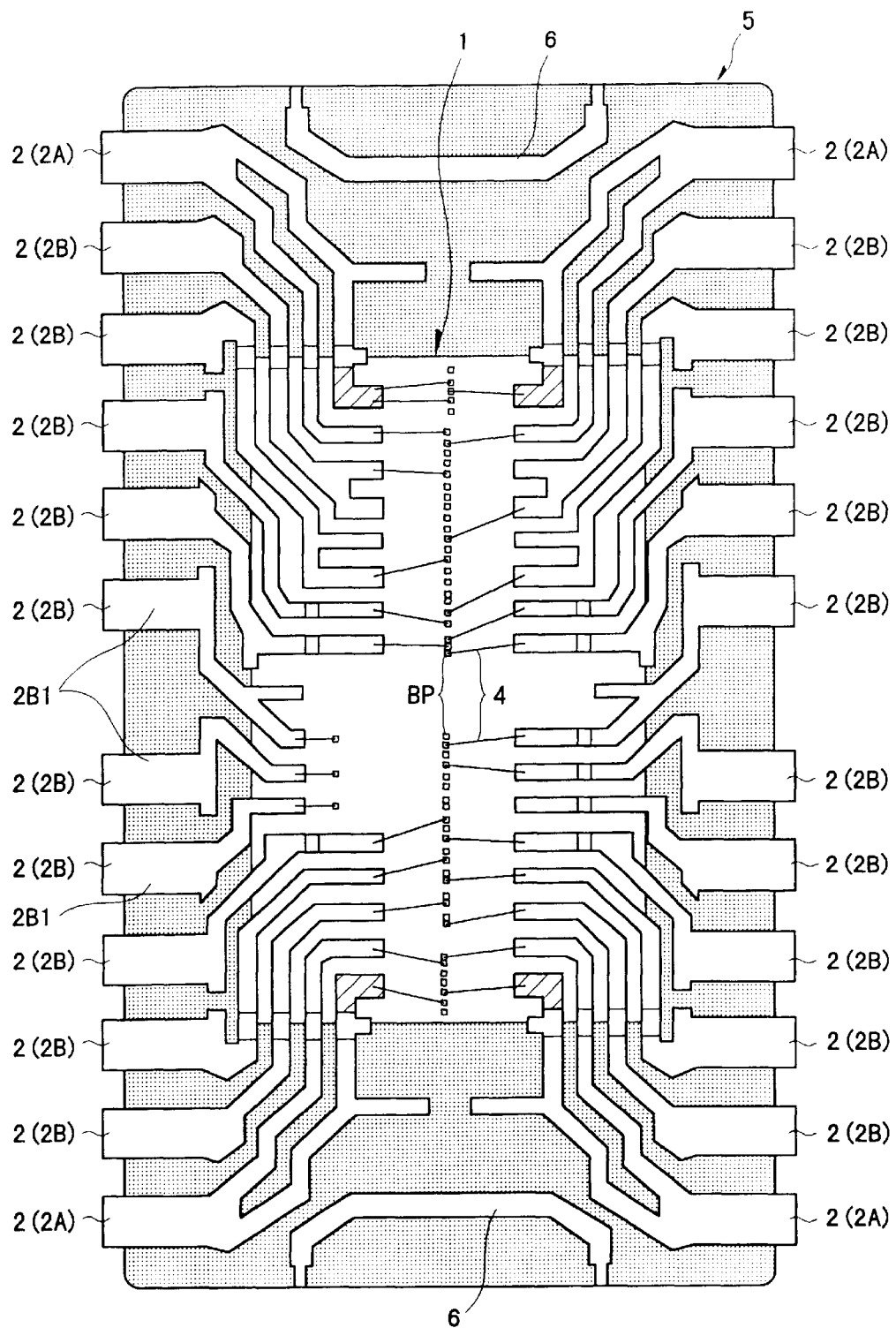
FIG. 8 is a plan view of a semiconductor device as a first modification of the above embodiment of the present invention from which a top portion of a resin sealer is removed.

In this embodiment, the end portions of the signal leads 2B are arranged near the external terminals BP disposed along the long sides of the semiconductor chip 1 in the center region of the main surface of the semiconductor chip 1. The end portions of some signal leads 2B out of the plurality of signal leads 2B may be arranged near the long side of the semiconductor chip 1 like signal leads 2B1 shown in FIG. 8. In this case, the areas opposite to the main surface of the semiconductor chip 1 of the signal leads 2B become small, thereby making it possible to further reduce floating capacitance (chip/lead capacitance) applied to the signal leads 2B. This is particularly effective for signal leads 2B which are used as signal terminals such as data input/output terminals and address terminals.

Figure 9:
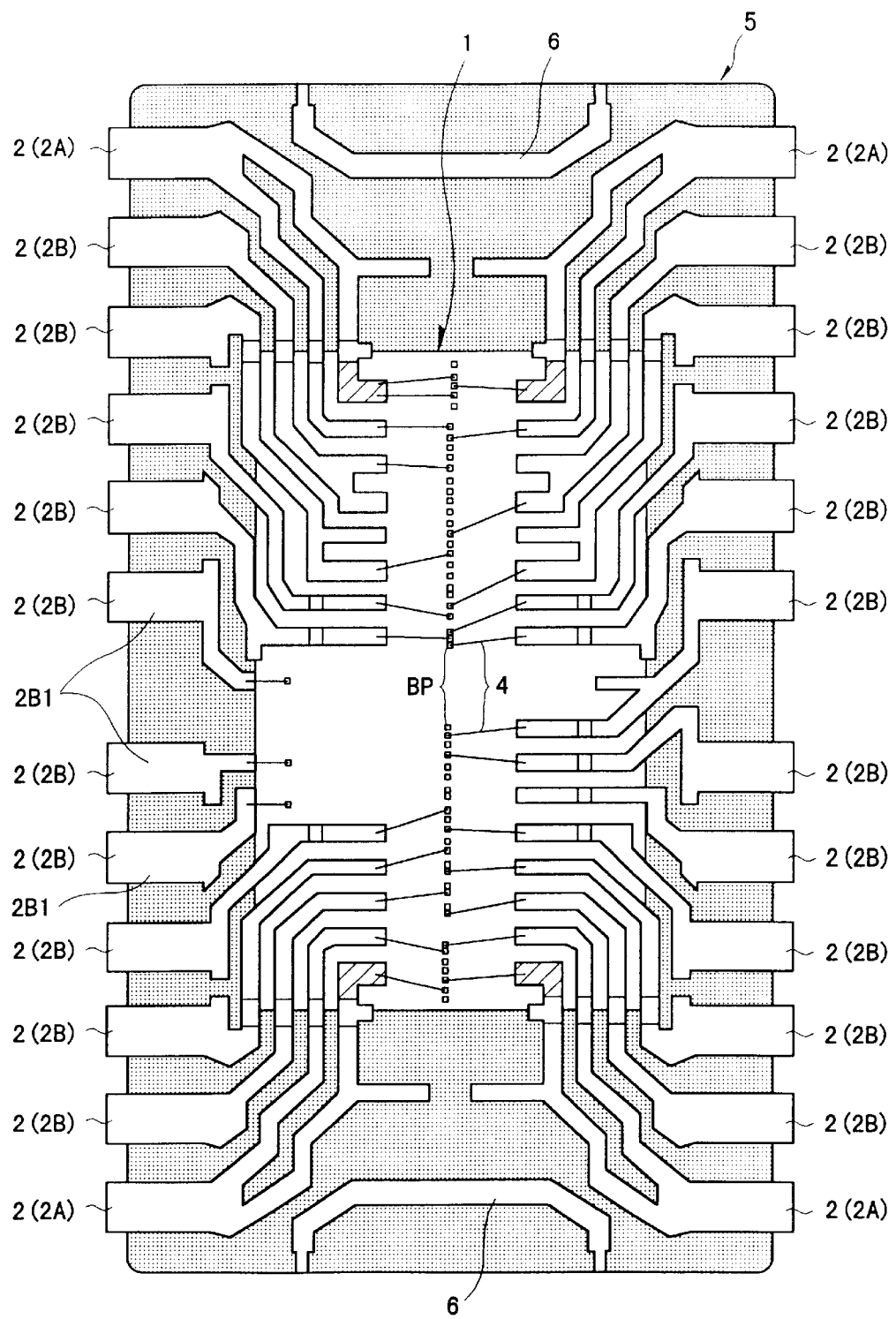
FIG. 9 is a plan view of a semiconductor device as a second modification of the above embodiment of the present invention from which a top portion of a resin sealer is removed.

In this embodiment, the end portions of the signal leads 2B are arranged near the external terminals BP disposed along the long sides of the semiconductor chip 1 in the center region of the main surface of the semiconductor chip 1. Some signal leads 2B out of the plurality of signal leads 2B may be arranged outside the periphery of the semiconductor chip 1 like signal leads 2B1 shown in FIG. 9. In this case, the area opposite to the main surface of the semiconductor chip 1 can be eliminated, thereby making it possible to further reduce floating capacitance (chip/lead capacitance) applied to the signal leads 2B. This is particularly effective for signal leads 2B which are used as signal terminals such as data input terminals and address terminals.

In this embodiment, the power supply leads 2A are fixed to the main surface of the semiconductor chip 1 to support the semiconductor chip 1. The signal leads which does not require the high signal propagation speed, for example, signal leads used as a chip select terminal and a testing terminal may be fixed to the main surface of the semiconductor chip 1 to support the semiconductor chip 1.

Figure 10:
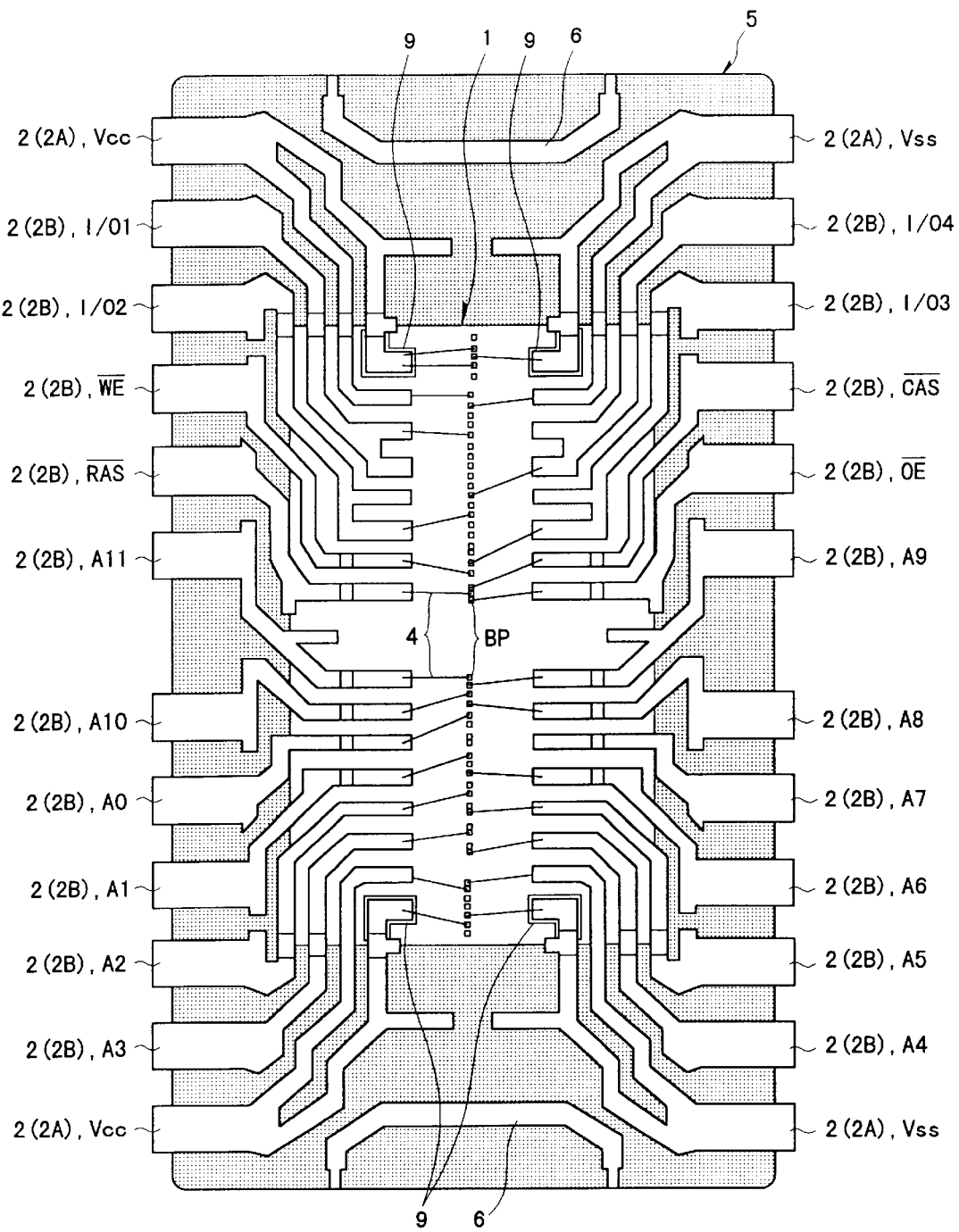
FIG. 10 is a plan view of a semiconductor device as a third modification of the above embodiment of the present invention from which a top portion of a resin sealer is removed.
Figure 11:
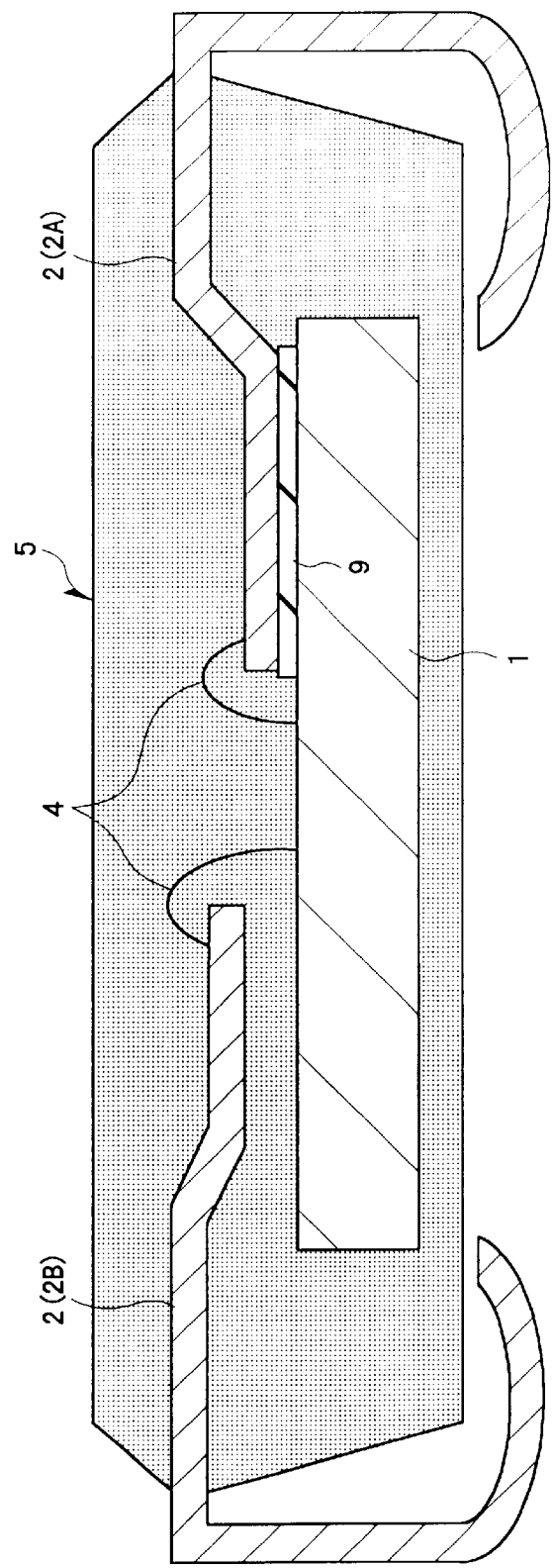
FIG. 11 is a sectional view of the semiconductor device as the third modification of the above embodiment of the present invention.

In this embodiment, the end portions of the inner portions of the power supply leads 2A are fixed to the main surface of the semiconductor chip through the adhesive layer 3. As shown in FIG. 10 and FIG. 11, the end portions of the inner portions of the power supply leads 2A may be fixed to the main surface of the semiconductor chip 1 through an insulating film (insulating tape) 9. The insulating film 9 has an adhesive layer formed of a polyimide-based resin formed on both sides (front side and rear side) of a resin substrate made from a polyimide-based resin. In this case, the thickness of the insulating film (including the adhesive layer) is about 80 $\mu$m and the interval between the end portions of the signal leads 2B and the semiconductor chip 1 is about 100 to 150 $\mu$m.

The present invention made by the present inventor has been described based on the above embodiment. However, it should be understood that the present invention is not limited to the above embodiment and may be modified and changed without departing from the spirit and scope of the invention.

For example, the present invention can be applied to an SOP (Small Out-line Package) or ZIP (Zigzag In-line Package) semiconductor device which is a one-way lead layout structure semiconductor device.

The present invention can be further applied to a DIP (Dual In-line Package) or TSOP (Thin Small Out-line Package) semiconductor device which is a two-way lead layout structure semiconductor device.

The present invention can be further applied to a QFP (Quad Flat Package) semiconductor device which is a four-way lead layout structure semiconductor device.

Industrial Applicability

The electrical characteristics of a semiconductor device can be improved.

The reliability of a semiconductor device can also be improved.

What is claimed is:

1. A semiconductor device having power supply leads and signal leads on the main surface of a semiconductor chip, wherein
the interval between the signal leads and the semiconductor chip is made larger than the interval between the power supply leads and the semiconductor chip.

2. The semiconductor device of claim 1, wherein a surface protective film is formed on the main surface of the semiconductor chip, and power source wires electrically connected to the power supply leads are formed under the surface protective film.

3. The semiconductor device of claim 1, wherein the power supply leads and the signal leads are electrically connected to respective external terminals arranged on the main surface of the semiconductor chip by wires, the semiconductor chip, the inner portions of the power supply leads, the inner portions of the signal leads and the wires are sealed by a resin sealer, and the outer portions of the power supply leads and the outer portions of the signal leads are drawn to the outside of the resin sealer.

4. A semiconductor device having power supply leads and signal leads on the main surface of a semiconductor chip, wherein
the interval between the signal leads and the semiconductor chip is made larger than the interval between the power supply leads and the semiconductor chip, the signal leads are separated from the main surface of the semiconductor chip, and the power supply leads are fixed to the main surface of the semiconductor chip.

5. A semiconductor device having power supply leads and signal leads on the main surface of a semiconductor chip, wherein
the interval between the signal leads and the semiconductor chip is made larger than the interval between the power supply leads and the semiconductor chip, the signal leads are separated from the main surface of the semiconductor chip, and the power supply leads are fixed to the main surface of the semiconductor chip directly or through an adhesive layer.

6. A semiconductor device having power supply leads and signal leads whose end portions are located on the semiconductor chip side on the main surface of a semiconductor chip, wherein
the interval between the end portions of the signal leads and the semiconductor chip is made larger than the interval between the end portions of the power supply leads and the semiconductor chip.

7. The semiconductor device of claim 6, wherein a surface protective film is formed on the main surface of the semiconductor chip, and power source wires electrically connected to the power supply leads are formed under the surface protective layer.

8. The semiconductor device of claim 6, wherein the power supply leads and the signal leads are electrically connected to respective external terminals arranged on the main surface of the semiconductor chip by wires, the semiconductor chip, the inner portions of the power supply leads, the inner portions of the signal leads and the wires are sealed by a resin sealer, and the outer portions of the power supply leads and the outer portions of the signal leads are drawn to the outside of the resin sealer.

9. A semiconductor device having power supply leads and signal leads whose end portions are located on the semiconductor chip side on the main surface of a semiconductor chip, wherein
the end portions of the signal leads are separated from the semiconductor chip, and the end portions of the power supply leads are fixed to the semiconductor chip.

10. A semiconductor device having power supply leads and signal leads whose end portions are located on the semiconductor chip side on the main surface of a semiconductor chip, wherein
the end portions of the signal leads are separated from the semiconductor chip, and the end portions of the power supply leads are fixed to the semiconductor chip directly or through an adhesive layer.

11. A method of manufacturing a semiconductor device having power supply leads and signal leads on the main surface of a semiconductor chip, comprising sealing the semiconductor chip, the inner portions of the power supply leads and the inner portions of the signal leads by a resin while the interval between the signal leads and the semiconductor chip is made larger than the interval between the power supply leads and the semiconductor chip, so as to form a resin sealer.

12. A method of manufacturing a semiconductor device having power supply leads and signal leads on the main surface of a semiconductor chip, comprising sealing the semiconductor chip, the inner portions of the power supply leads and the inner portions of the signal leads by a resin while the interval between the signal leads and the semiconductor chip is made larger than the interval between the power supply leads and the semiconductor chip, the signal leads are separated from the semiconductor chip, and the power supply leads are fixed to the semiconductor chip, so as to form a resin sealer.

13. A method of manufacturing a semiconductor device having power supply leads and signal leads on the main surface of a semiconductor chip, comprising sealing the semiconductor chip, the inner portions of the power supply leads and the inner portions of the signal leads by a resin while the interval between the signal leads and the semiconductor chip is made larger than the interval between the power supply leads and the semiconductor chip, the signal leads are separated from the semiconductor chip, and the power supply leads are fixed to the semiconductor chip directly or through an adhesive layer, so as to form a resin sealer.

14. A semiconductor device having power supply leads and signal leads on the main surface of a semiconductor chip, wherein the signal leads are separated from the main surface of the semiconductor chip, and the power supply leads are fixed to the main surface of the semiconductor chip.

15. A semiconductor device comprising;

a rectangular semiconductor chip having a plurality of semiconductor elements and a plurality of external terminals on the main surface, the plurality of external terminals being arranged in a longitudinal direction;

first leads and second leads, each having inner portions and outer portions, parts of the inner portions being arranged on the main surface of the semiconductor chip, and the end portions of the inner portions being arranged near the plurality of external terminals and electrically connected to the plurality of external terminals; and a rectangular resin sealer for sealing the semiconductor chip and the inner portions of the first leads and the second leads, whose long sides extend along the long sides of the semiconductor chip and whose short sides extend along the short sides of the semiconductor chip, wherein the outer portions of the first leads and the second leads project from the long sides of the resin sealer;

the inner portions of the first leads and the second leads extend over the short sides of the semiconductor chip and lie on the main surface of the semiconductor chip;

the distance between parts of the inner portions of the second leads lying on the main surface of the semiconductor chip and the main surface of the semiconductor chip is larger than the distance between parts of the inner portions of the first leads lying on the main surface of the semiconductor chip and the main surface of the semiconductor chip; and the first leads are connected to fixed potential terminals out of the plurality of external terminals and the second leads are connected to signal terminals out of the plurality of external terminals.

16. The semiconductor device of claim 15, wherein the first leads and the second leads are offset such that parts of the inner portions lying on the main surface of the semiconductor chip are closer to the main surface of the semiconductor chip than the other parts of the inner portions lying outside the main surface of the semiconductor chip in the vicinity of the short sides of the semiconductor chip, and the offset amount of the second leads is smaller than the offset amount of the first leads.

17. The semiconductor device of claim 16, wherein parts of the inner portions of the first leads lying on the main surface of the semiconductor chip are bonded to the main surface of the semiconductor chip.

18. The semiconductor device of claim 17, wherein parts of the inner portions of the first leads lying on the main surface of the semiconductor chip are bonded to the main surface of the semiconductor chip by an adhesive.

19. The semiconductor device of claim 17, wherein parts of the inner portions of the first leads lying on the main surface of the semiconductor chip are bonded to the main surface of the semiconductor chip by an insulating tape.

* * * * *